(12) United States Patent
Oda et al.

(10) Patent No.: US 8,298,872 B2
(45) Date of Patent: Oct. 30, 2012

(54) MANUFACTURING METHOD FOR SEMICONDUCTOR DEVICE

(75) Inventors: Takashi Oda, Ibaraki (JP); Eiji Toyoda, Ibaraki (JP); Mitsuaki Fusumada, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 144 days.

(21) Appl. No.: 12/964,204

(22) Filed: Dec. 9, 2010

(65) Prior Publication Data

US 2011/0143501 A1 Jun. 16, 2011

(30) Foreign Application Priority Data

Dec. 10, 2009 (JP) ................... 2009-280806

(51) Int. Cl.
*H01L 21/00* (2006.01)
(52) U.S. Cl. ........................................................ 438/124
(58) Field of Classification Search .................... 438/124
See application file for complete search history.

(56) References Cited

U.S. PATENT DOCUMENTS

| 6,379,159 | B1 | 4/2002 | Mune et al. | |
|---|---|---|---|---|
| 6,486,562 | B1* | 11/2002 | Kato | 257/778 |
| 6,780,668 | B1* | 8/2004 | Tsukahara et al. | 438/106 |
| 7,134,198 | B2 | 11/2006 | Nakatani et al. | |
| 7,141,509 | B2* | 11/2006 | Igarashi et al. | 438/720 |
| 7,202,107 | B2* | 4/2007 | Fuergut et al. | 438/112 |
| 7,566,584 | B2* | 7/2009 | Ito | 438/106 |
| 7,595,228 | B2* | 9/2009 | Abe et al. | 438/123 |
| 7,893,545 | B2* | 2/2011 | Otremba | 257/781 |
| 8,124,457 | B2* | 2/2012 | Oda et al. | 438/118 |
| 8,183,093 | B2* | 5/2012 | Yoshida et al. | 438/118 |
| 2003/0089520 | A1* | 5/2003 | Ooyabu et al. | 174/255 |
| 2003/0219608 | A1* | 11/2003 | Ishizaka et al. | 428/469 |
| 2004/0082100 | A1* | 4/2004 | Tsukahara et al. | 438/106 |
| 2005/0030696 | A1* | 2/2005 | Ouchi et al. | 361/271 |
| 2008/0079151 | A1* | 4/2008 | Okayama | 257/737 |
| 2008/0138937 | A1* | 6/2008 | Yamagata | 438/124 |
| 2010/0244229 | A1* | 9/2010 | Vittu | 257/692 |
| 2010/0264552 | A1* | 10/2010 | Nakasato et al. | 257/778 |
| 2011/0278741 | A1* | 11/2011 | Chua et al. | 257/777 |

FOREIGN PATENT DOCUMENTS

| JP | 03-178152 A | 8/1991 |
|---|---|---|
| JP | 2000-349198 A | 12/2000 |
| JP | 2001-044589 A | 2/2001 |
| JP | 2001-332654 A | 11/2001 |
| JP | 2002-226794 A | 8/2002 |
| JP | 2005-012089 A | 1/2005 |
| JP | 2005-142208 A | 6/2005 |
| JP | 2006-093575 A | 4/2006 |

* cited by examiner

*Primary Examiner* — N Drew Richards
*Assistant Examiner* — Grant Withers
(74) *Attorney, Agent, or Firm* — Leydig, Voit & Mayer, Ltd.

(57) ABSTRACT

Provided is a method of producing a semiconductor device having a structure wherein a semiconductor chip 3 is mounted on a wiring circuit substrate 2 and sealed with a resin. A wiring circuit substrate 2 having a connecting conductor portion that can be connected to an electrode of the chip is formed on a metal support layer 1 in a way such that the substrate can be separated from the metal support layer, the chip 3 is mounted on the wiring circuit substrate 2, a sheet-shaped resin composition T is placed on the chip and heated on the chip to seal the chip, and the metal support layer is separated and divided to obtain individual semiconductor devices.

8 Claims, 6 Drawing Sheets

(a)

(b)

(c)

(a)

(b)

(a)

(b)

(a)

(b)

(c)

(d)

(e)

(a)

(b)

MANUFACTURING METHOD FOR SEMICONDUCTOR DEVICE

FIELD OF THE INVENTION

The present invention relates to a method of producing a semiconductor device having a structure wherein a semiconductor chip is mounted on a wiring circuit substrate and sealed with a resin.

BACKGROUND OF THE INVENTION

Semiconductor elements (hereinafter also simply referred to as "elements") configured with various semiconductor materials such as ICs prepared using silicon semiconductors and organic EL elements prepared using organic semiconductors are usually produced by repeatedly forming a matrix of multiple elements on a wafer substrate, then dicing the substrate into individual semiconductor chips (also referred to as bare chips).

In the explanation below, a wafer substrate having multiple semiconductor elements formed thereon (pre-dicing state) is referred to as "a semiconductor wafer", and a semiconductor chip is sometimes simply referred to as a "chip".

In recent years, there has been the trend toward increased use of methods of connecting (mounting) a chip to (on) an external wiring circuit substrate while the conductor portion of the wiring circuit substrate corresponds to the electrode position of the chip (e.g., flip chip bonding). An external wiring circuit substrate includes a circuit substrate for a package to be sealed together with a chip, an ordinary circuit substrate to have many other elements mounted thereon and the like.

In connecting a chip and a circuit substrate for packages, a flexible wiring circuit substrate with a contact point, known as an interposer, is sometimes interposed therebetween (JP-A-2000-349198, JP-A-2001-44589).

The above-described flexible wiring circuit substrate such as interposer is difficult to handle in manufacturing steps such as chip mounting because of their flexibility.

Therefore, it is a conventional practice to first form a flexible wiring circuit substrate on a metal support substrate to ensure adequate rigidity and improved handleability during processing, then mount a chip on the wiring circuit substrate and cover and seal the chip with a resin, and subsequently remove the metal support substrate, as disclosed in JP-A-2000-349198, JP-A-2001-44589, US Patent Publication U.S. Pat. No. 7,202,107 B2 and the like.

A chip mounted on a wiring circuit substrate and sealed with a resin, and after removal of the metal support substrate, serves as an independent semiconductor device that is equipped with a conductor for connection that facilitates connection to an external conductor (external circuit and the like) and mounting, compared with a bare chip merely having an exposed electrode pad, and that is packaged with a resin.

Usually, a large number of wiring circuit substrates for individual chips collectively form one sheet having a large area so that a large number of (e.g., about 40 to 100) chips can be mounted on the wiring circuit substrates.

Therefore, in sealing chips with a resin, a liquid resin 300 is added drop by drop to a large number of chips 200 mounted on a wiring circuit substrate 100 having a large area, as shown in FIG. 6(*a*), and the chips are pressed and heated using a molding die (comprising an upper die 400 and a lower die 410) to set the resin and complete the sealing, as shown in FIG. 6(*b*). The wiring circuit substrate 100 with a large area, which has the large number of chips integrally sealed with the resin thereon, is then has the metal support layer 110 removed therefrom, and is divided into individual semiconductor devices.

The present inventors investigated the steps of mounting a chip on a conventional flexible wiring circuit substrate as described above, of sealing the chip with a resin, and of removing the metal support layer, and found that these steps involve two complicated processes.

One of the two processes is a sealing process for setting a liquid resin in a molding die, as shown in FIGS. 6(*a*) and (*b*). The liquid form of the resin used complicates its supply and the management of its amount and quality in the sealing; fluctuations of these factors are likely to cause molding quality variation. Other problems include laborious in the maintenance of the resin supply system.

In the sealing process with a liquid resin, the liquid resin added drop by drop flows laterally while being pressed and distributed up and down in the die, so that a major lateral force sometimes works on the elements, which in turn can pose the problem of a positional shift of the elements resulting in breakage of the connection between each element and the wiring circuit substrate.

The other of the two complicated processes is the removal of the metal support substrate after resin sealing, wherein etching is unavoidably used to remove the metal support substrate because the metal support substrate and the wiring circuit substrate are formed as a unified laminated structure. Traditionally, this removal of the metal support substrate by etching has been deemed unproblematic as it is a usual process. However, the process involves complicated steps, including resist provision, immersion in etching liquid, resist removal, cleaning and the like, resulting in increased manufacturing costs. The inability to reuse the metal support substrate is also problematic because the metal support substrate disappears.

It is an object of the present invention to solve the above-described problems and simplify the entire manufacturing process, from mounting a chip on a flexible wiring circuit substrate to sealing the chip with a resin and obtain a semiconductor device.

SUMMARY OF THE INVENTION

The present inventors diligently investigated to accomplish the above-described object, and found that by previously providing a metal support layer on a wiring circuit substrate in a way such that the metal support layer can be separated, that is, previously forming a wiring circuit substrate on a metal support layer in a way such that the wiring circuit substrate can be separated from the metal support layer, and sealing a chip using a sheet-shaped resin composition, without using a liquid resin, the resin sealing operation is simplified, and the subsequent removal of the metal support layer can be achieved by a simple peeling operation, resulting in significant simplification of the entire process. The inventors conducted further investigations based on this finding, and have developed the present invention.

Accordingly, the present invention provides the following:
(1) A method of producing a semiconductor device having a structure wherein a semiconductor chip is mounted on a wiring circuit substrate and sealed with a resin, wherein the method comprises the steps of:

forming a wiring circuit substrate having, on a metal support layer, a connecting conductor portion that can be connected to an electrode of the semiconductor chip in a way such that the wiring circuit substrate can be separated from the metal support layer, and that the connecting conductor portion is located on the upper face side of the wiring circuit substrate, connecting the connecting conductor portion of the wiring circuit substrate and the electrode of the semiconductor chip, to mount the semiconductor chip on the wiring circuit substrate, placing a sheet-shaped resin composition made of a sealing resin composition on the semiconductor chip mounted on the wiring circuit substrate, and heating the a sheet-shaped resin composition to seal the semiconductor chip with the sealing resin composition, and separating the metal support layer from the wiring circuit substrate after sealing.

(2) The manufacturing method described in (1) above, wherein the sheet-shaped resin composition is a sheet-shaped epoxy resin composition containing an epoxy resin, a phenol resin, an elastomer, an inorganic filler, and a curing promoter as ingredients.

(3) The manufacturing method described in (1) or (2) above, wherein a release layer is present between the metal support layer and the wiring circuit substrate, whereby the wiring circuit substrate can be separated from the metal support layer.

(4) The manufacturing method described in (3) above, wherein the release layer is made of polyimide.

(5) The manufacturing method described in (3) above, wherein the release layer is made of one material selected from among metal, metal oxide, and inorganic oxide.

Numerical codes used in these drawings denote the following: 1; metal support layer, 2; wiring circuit substrate, 3; semiconductor chip, 4; bump, 5; release layer, T; sheet-shaped resin composition, t; chip-sealing resin composition, S; semiconductor device

DETAILED DESCRIPTION OF THE INVENTION

Firstly, according to the manufacturing method of the present invention, in the resin sealing step, a resin material is simply supplied in the form of a sheet and, in the metal support layer removal step, the layer is separated in a sheet form, so that the entire process is much simplified, resulting in a reduction in the manufacturing cost.

In particular, the sheet-shaped resin composition is a solid sheet, so that the handling of the sealing resin composition and its feeding into the mold in the step are easy because of the sheet form. The sheet is supplied with a predetermined thickness, thus obviating the need for weighing the resin in the molding apparatus. Additionally, the absence of voids in the sheet enables easy obtainment of a void-free molded product.

Furthermore, in resin sealing with a sheet-shaped resin composition, the sheet-shaped resin composition is placed in a way such that it uniformly covers all elements already at the beginning, so that the lateral flow of the resin composition is prevented, thus obliterating the problem of the lateral shift of chips.

In the metal support layer removal step, the removal is achieved simply by peeling the layer in the form of a metal foil as it is, and the separated metal support layer is reusable, resulting in a reduction in the manufacturing cost.

Hereinafter, the manufacturing method of the present invention is described with reference to specific examples. As used herein, terms indicating upward or downward, such as "upper face" and "lower face", are only to explain the positional relationship of layers, and are not to be construed as limiting the actual vertical position of a wiring circuit layer or a semiconductor device.

Figure 1:
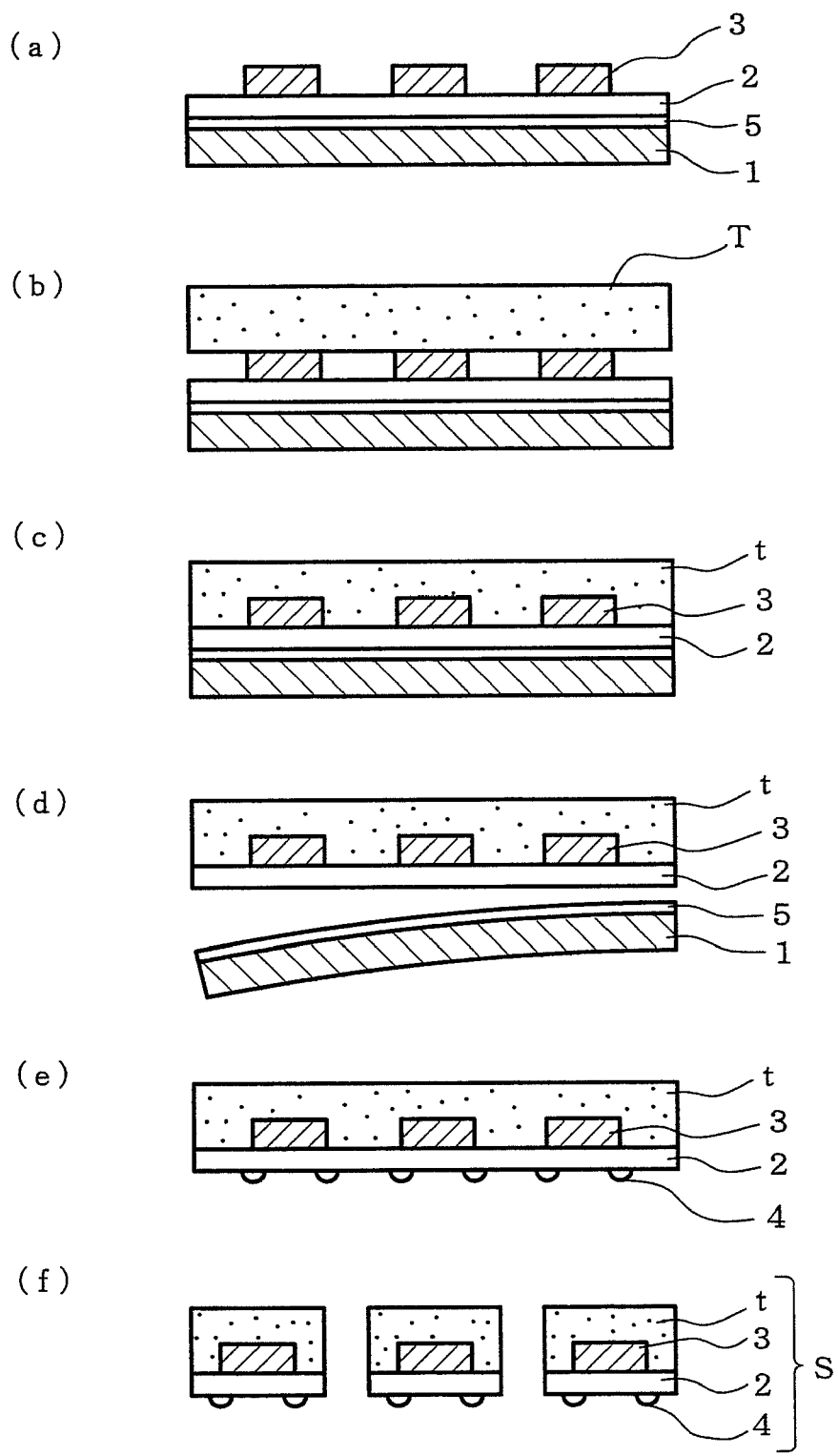
FIG. 1 shows schematic cross-sectional diagrams of how a semiconductor device is formed through the various steps in the manufacturing process of the present invention. Hatching is given as appropriate to distinguish different regions (the same applies to other drawings).

FIG. 1 schematizes how a product is formed through the various steps to explain the manufacturing method of the present invention, wherein a wiring circuit substrate 2 has a laminated structure having on the upper face side thereof a connecting conductor portion that can be connected to electrodes of semiconductor chips 3, with a conductor layer provided therein. Details of this structure are described below with reference to FIG. 2.

In the manufacturing method, the wiring circuit substrate 2 is first formed on a metal support layer 1 in a way such that the substrate can be separated from the support layer. In the example shown in FIG. 1, a release layer 5 is interposed to make the lamination in which the substrate can be separated. The release layer is described below.

Subsequently, as shown in FIG. 1(a), the connecting conductor portion of the wiring circuit substrate 2 and the electrodes (not illustrated) of the semiconductor chips 3 are connected, and the semiconductor chips are mounted on the wiring circuit substrate.

Subsequently, as shown in FIG. 1(b), a sheet-shaped resin composition T made of a sealing resin composition is placed and heated on the semiconductor chips mounted on the wiring circuit substrate (with pressurization added as required), whereby the semiconductor chips are sealed with a sealing resin composition t that is the material for the sheet-shaped resin composition T, as shown in FIG. 1(c).

After the sealing, the metal support layer 1 is separated from the wiring circuit substrate 2, as shown in FIG. 1(d). In this operation, in the embodiment in FIG. 1, the metal support layer 1 and the release layer 5 together become separated from the wiring circuit substrate 2 while in the sheet-shaped state.

These operations much simplify the resin sealing step after chip mounting and the metal support layer separation step, as described in the Effect of the Invention, resulting in a reduction in the manufacturing cost.

In a preferred embodiment of the manufacturing method of the present invention, as shown in FIG. 1, a wiring circuit substrate is previously prepared in a way such that a large number of chips can be mounted thereon, the chips are covered together with a sheet-shaped resin composition T and sealed with a resin composition t, and a metal support layer 1 is separated, after which bumps (including solder balls) 4 are formed in a conductor portion exposed in the lower face (described below), as shown in FIG. 1(e), and the substrate is divided into individual semiconductor devices S, as shown in FIG. 1(f).

In the example shown in FIG. 1, three chips are illustrated for the sake of explanation. In the actual manufacturing process, however, the number of chips that can be collectively mounted on one of wiring circuit substrates is about 40 to 100, the arrangement thereof being preferably in a matrix pattern to facilitate the dicing process.

Figure 2:
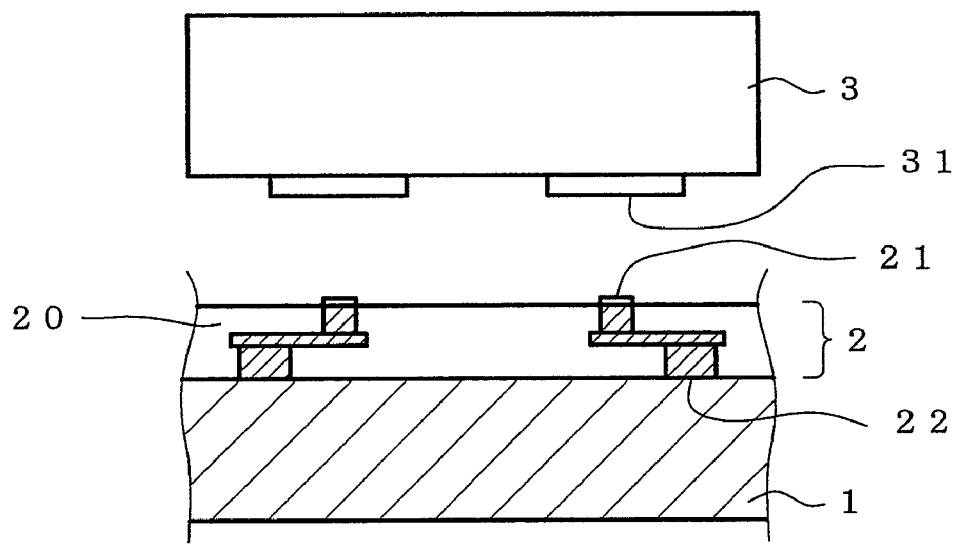
FIG. 2 shows magnified views of details of how one chip is mounted on the wiring circuit substrate in FIG. 1. The inner structure of the wiring circuit substrate represents an example out of various variations.
Figure 2:
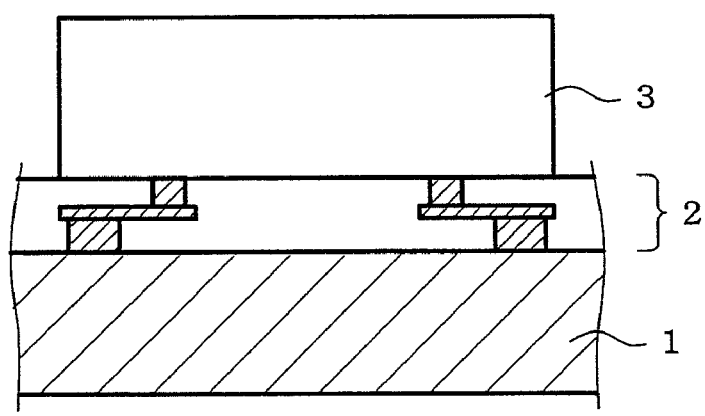
Figure 2:
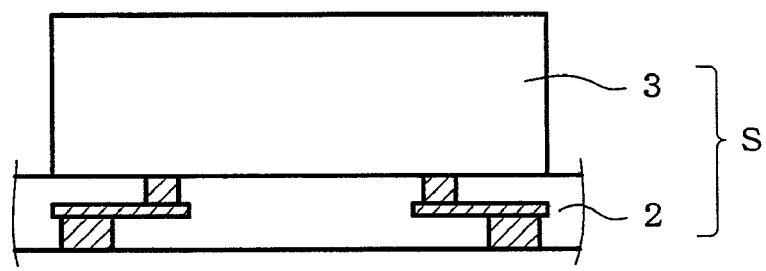

The wiring circuit substrate 2 has a connecting conductor portion 21 that can be connected to an electrode 31 of a semiconductor chip 3 for connection, as shown in the enlarged cross-sectional view in FIG. 2(a). In the case of FIG. 2, the connecting conductor portion 21 is exposed to the upper face (the face opposite to the face on the metal support layer 1 side) to allow the electrode 31 of the semiconductor chip 3 to be directly connected (i.e., to enable bare chip mounting).

In the actual manufacturing process, the face on which the connecting conductor 21 is exposed may be further covered with a release liner, which may be removed just before connection to the semiconductor chip.

In FIG. 2(a), the connecting conductor portion 21, the electrode 31 and the like are illustrated as if they are more protruded than the actual state, so as to indicate their positions clearly. For the sake of explanation, one chip is shown to have two electrodes; in the reality, however, the number of electrodes is widely variable at several to several ten thousand electrodes and the like, depending on chip scale and the degree of integrality, and the electrode arrangement pattern on the electrode face of the chip is also widely variable.

An electrode of the chip is a flat metal conductor pad in some cases, and has a gold stud bump, an underbump metal (UBM) and the like formed thereon in other cases. The UBM is exemplified by Ni/Au layers formed by electroless plating (Ni is on the undercoat side; the same applies below, i.e., the undercoat side of the lamination is indicated first), Ti/Cu layers, Ti/W/Cu layers, and Ti/Ni/Cu layers formed by sputtering, and the like.

In FIG. 2, a magnified view is provided to explain how one chip is mounted on a wiring circuit substrate 2. As stated above, however, the wiring circuit substrate may allow many chips to be mounted thereon, or may be an array as it is, or may be dividable into individual semiconductor devices.

Subsequently, as shown in FIG. 1(a) or FIG. 2(b), the semiconductor chip 3 is mounted on the wiring circuit substrate 2 formed on the metal support layer 1 (mounting step). In this mounting step, the connecting conductor portion 21 of the wiring circuit substrate 2 and the electrode 31 of the chip 3 are connected.

In FIG. 2(b), the protrusions of the connecting conductor portion 21 and the electrode 31 after mounting are omitted. In the actual step, the semiconductor chip 3 and the wiring circuit substrate 2 become bonded in close contact, without a gap, by pressurization.

The semiconductor device in the present invention may be any device having an element structure that can be mounted on a wiring circuit substrate and connected thereto. Examples include conventionally known elements such as those of simple structure like single light-emitting elements, arrays comprising an assembly thereof, organic semiconductor elements, ICs, processors with various operation circuits integrated therein, memories, photosensors, and image sensors, as well as multi-chip modules, MEMS (micro-electro-mechanical systems; devices wherein machine components, sensors, actuators, electronic circuits and the like are integrated on a substrate) and the like.

The wafer substrate to form a semiconductor element thereon may be any substrate for semiconductor elements including, for example, semiconductor crystal substrates such as of silicon, as well as insulating crystal substrates, glass substrates, substrates of an organic compound, and the like. Of these substrates, the most versatile ones are silicon crystal substrates (silicon wafers).

The semiconductor element may have a rewiring layer formed therein in the stage of a semiconductor wafer, and may have a through hole via (conductive path) that penetrates the substrates for the element formed, the electrode extending to the face opposite to the chip's electrode side (back face of the substrate for the element).

The wiring circuit substrate may function as an interposer or rewiring layer that mediates the connection to an external conductor when a semiconductor chip is mounted thereon.

In case of a structure wherein a through hole via (conductive path) is present in the substrate for the element, and the electrode of the semiconductor chip is communicable to the back face side, as described above, the connecting conductor of the wiring circuit substrate may be connected to the terminal of the through hole via. In this case, the wiring circuit substrate may be used to connect the chip electrode and the through hole via on the element side of the chip, and the wiring circuit substrate may be stacked on both the back face side and the element side of the chip.

The connection between the chip electrode and the connecting conductor portion of the wiring circuit substrate may be by wire bonding, preference is given to a mode of mounting where the chip electrode is bonded directly to the connecting conductor portion, such as flip chip mounting.

In case of flip chip mounting, publicly known methods of bonding can be used; examples include Au—Au bonding, Au stud bump-solder bonding, solder bump bonding, bonding using Ag paste, and bonding using ACF (anisotropic conductive film) or NCF (non-conductive film). To meet a demand for fine pitches, Au stud bump-solder bonding is suitably used. If a gap is produced between the chip and the wiring circuit substrate because of a bump height and the like, an underfill material or the like may be filled.

As stated above, the wiring circuit substrate is preferably in the mode wherein a required number of wiring circuit substrates corresponding to individual chips are arranged in sequence in one plane to collectively form wiring circuit substrates with a large area (simple sheets, bands rolled out from a roll, and the like) to allow the plurality of chips to be mounted thereon, with the provision of dicing, because this is suitable for mass production. The mode wherein chips are stacked in multiple layers is preferred for the purpose of increasing package density. The wiring circuit substrate may have a plurality of chips mounted thereon to constitute one semiconductor device.

Although the inner structure and conductor connection structure of the wiring circuit substrate are not particularly limited, a useful basic structure is such that, as shown in FIG. 2(a), a connecting conductor 21 for connection to an electrode of a chip is present on one face of an insulating layer, a conductor portion for external connection to an external conductor (a pad of an external circuit on which the semiconductor device is to be mounted, and the like) is present on the other face, and these conductors are mutually connected via a conductor layer provided in the insulating layer.

In addition to this representative structure, other examples include a structure wherein particular connecting conductors 21a and 21b are mutually connected (FIG. 3(a)), a structure wherein one connecting conductor is connected to a plurality of conductor portions for external connection (not illustrated), a structure wherein particular connecting conductors 21a and 21b are mutually connected in the layer, but are not connected to the conductor for external connection on the lower face of the wiring circuit layer (FIG. 3(b)), and the like; the pattern of the connection structure may be freely varied and combined according to the intended use.

Figure 3:
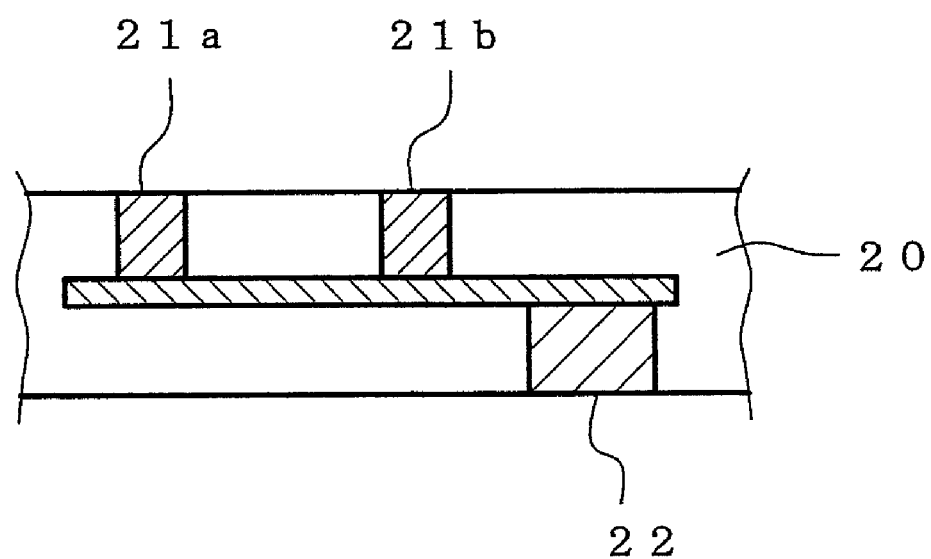
FIG. 3 shows other embodiments of the inner and conductor connection structures of a wiring circuit layer formed by the present invention.
Figure 3:
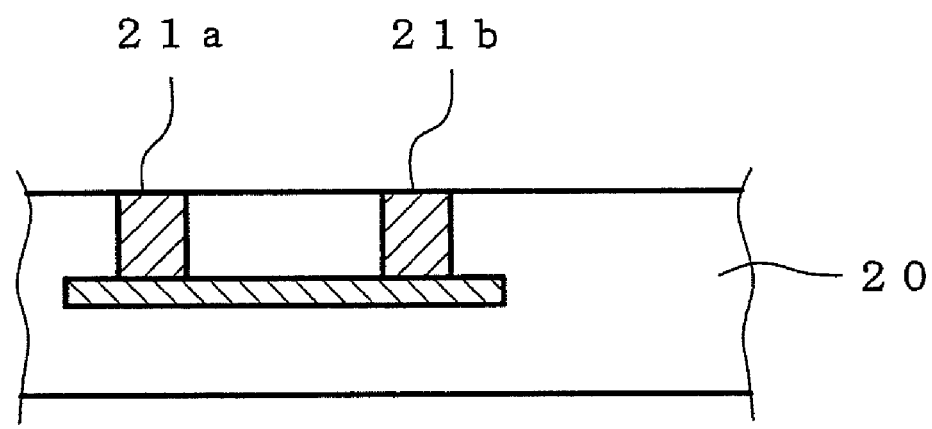

The wiring in the wiring circuit substrate (the conductor layer extending laterally in the layer) may a single-layer structure as shown in FIGS. 2, 3 and 4(a), or a multiple-layer structure as shown in FIG. 4(b).

Figure 4:
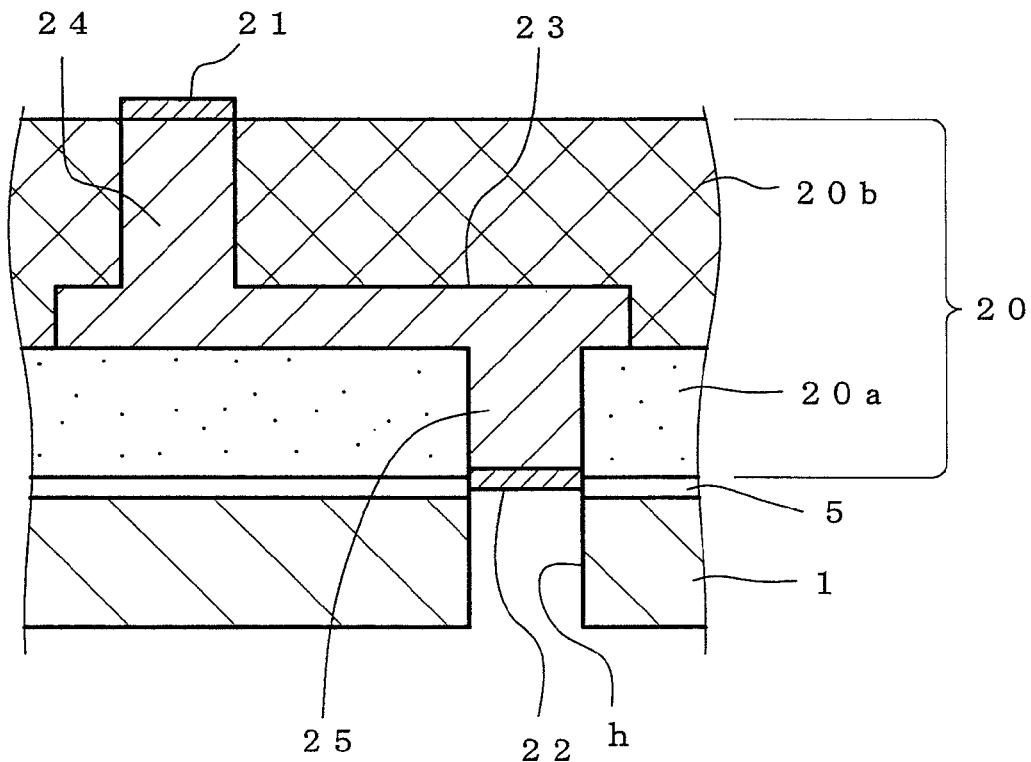
FIG. 4 shows schematic diagrams in greater detail of an example inner structure of a wiring circuit substrate, wherein only one connecting conductor portion for connection to one electrode of one chip and one external connecting conductor portion corresponding thereto on the back face are illustrated in magnified views (the same applies to FIG. 5).
Figure 4:
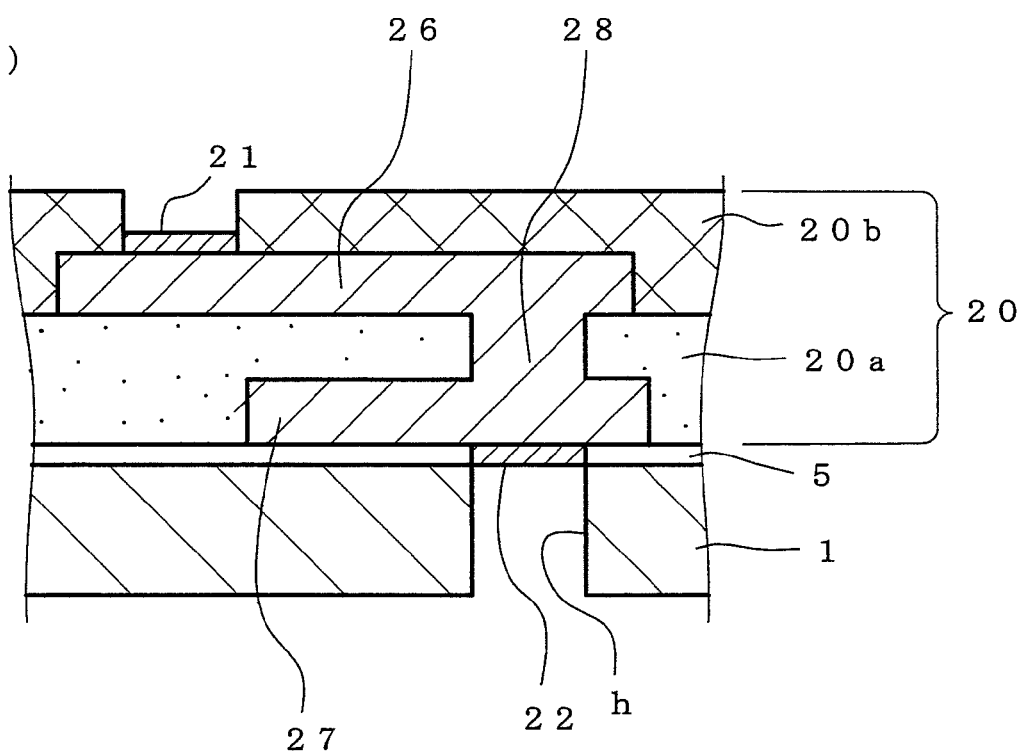

FIG. 4 shows schematic view of examples of the inner structure of a wiring circuit layer in further details.

In the example shown in FIG. 4(a), a conductor layer 23 with a specified connection pattern is present in an insulating layer 20, wherein the tip of a conductive path 25 (metal column) 24 extending from the conductor layer 23 to the element side constitutes a connecting conductor portion 21, whereas the tip of a conductive path 25 (metal column) 25 extending in reverse from the conductor layer 23 to the metal support substrate side constitutes a conductor for external connection 22. In this example, a metal film is present on the tip of each conductive path for more preferred electrical connection and increased corrosion resistance.

In the example shown in FIG. 4(b), a conductor layer 26 on the element side and a conductor layer 27 on the metal support substrate side are provided in an insulating layer 20 while in a state vertically separated to two stages. The conductor layer 26 on the element side is embedded in the insulating layer (in this example, covered with an adhesive layer 20b). In this example, the conductor layer 27 on the metal support substrate side is provided in direct contact with a release layer 5. As such, the conductor layers 26 and 27 are mutually connected via a conductive path 28 provided in a specified position therebetween. On the upper face of the adhesive layer 20b, an opening is present in a specified position, into which the conductor layer 26 is exposed; the exposed portion in the opening acts as a connecting conductor 21 for connection to the element. In this example, the lower face of the conductor layer 27 on the metal support substrate side is entirely exposed to the lower face of the insulating layer; an opening (through hole h) is present in a specified position on the lower face of a metal support substrate 1, the release layer 5 has been removed to expose the lower face of the conductor layer 27, and the exposed portion in the opening functions as a conductor portion for external connection 22. The exposed portion in each opening may simply have the conductor layer exposed; in this example, however, a metal film is present on the surface of each exposed portion for more preferred electrical connection and increased corrosion resistance.

The above-described metal film is preferably formed by plating. Useful materials for the metal film include simple metals such as copper, gold, silver, platinum, lead, tin, nickel, cobalt, indium, rhodium, chromium, tungsten, and ruthenium, alloys made of two or more thereof, and the like. Preferred materials include gold, tin, nickel and the like. Preferred modes of the metal film include a double-layer structure with an underlayer of Ni and a top layer of Au and the like.

As shown in FIGS. 4(a) and (b), an opening (through hole h) is provided in the metal support layer at a position corresponding to the conductor for external connection 22, whereby the tip of the conductor for external connection 22 is allowed to protrude from the lower face of the insulating layer 20a.

The insulating layer 20 of the wiring circuit layer may be a single layer made of the same polymer, and may also be a lamination structure having a base insulating layer 20a on the metal support substrate side and an adhesive layer 20b for adhesion to an element, as shown in FIGS. 4(a) and (b). Provided that the electrode of the element and the connecting conductor portion of the wiring circuit substrate become unified with sufficient mechanical strength upon bonding thereof, the adhesive layer may be omitted, and the insulating layer 20 may be a publicly known insulating layer with no adhesiveness.

Examples of materials for the base insulating layer include, but are not limited to, publicly known synthetic resins such as polyimide resin, acrylic resin, polyether nitrile resin, polyether sulfone resin, epoxy resin, polyethylene terephthalate resin, polyethylene naphthalate resin, and polyvinyl chloride resin, as well as composites of these resins with synthetic fiber cloth, glass cloth, nonwoven glass fabric, microparticles such as of $TiO_2$, $SiO_2$, $ZrO_2$, minerals, and clay, and the like. In particular, preference is given to polyimide resin, epoxy resin, and glass cloth-epoxy resin because a thinner flexible insulating layer with higher mechanical strength and better electrical characteristics (insulating characteristic and the like) is obtained after the metal support layer is and separated.

The thickness of the base insulating layer is preferably 3 to 50 μm.

Preferred materials for the adhesive layer include, but are not limited to, thermoplastic resins such as polysulfone, polyether sulfone, polyhydantoin, polyether imide, polyester, polyimide siloxane, and siloxane-modified polyamide imide, as well as epoxy resins, acrylic resins, silicone resins, polyimide resins and the like; these may be used in blends.

Useful epoxy resins include, but are not limited to, epoxy resins blended with a thermoplastic resin, rubber, elastomer and the like, silica hybrids, nano-particle-dispersed epoxy resins and the like.

Examples of useful acrylic resins include, but are not limited to, epoxy acrylate, urethane acrylate, silicone acrylate and the like.

The thickness of the adhesive layer is preferably 1 to 100 μm.

Formation of a wiring circuit substrate on a metal support layer can be achieved by conventionally known methods for producing circuit substrates or interposers, such as the semi-additive method and the subtractive method.

By forming a wiring circuit substrate on a metal support layer, the dimensional stability during the manufacturing process is increased, and the handleability of the thin wiring circuit substrate is improved.

When a conductor layer and a conductive path are formed in a wiring circuit substrate by the semi-additive method, it is preferable to form a seed film (metal thin film) by sputtering in advance, to allow a metal material to deposit well on the wall surface of the portion to become the conductor layer and a conductive path. Examples of useful materials for such a seed film include simple metals such as copper, gold, silver, platinum, lead, tin, nickel, cobalt, indium, rhodium, chromium, tungsten, and ruthenium, alloys made of two kinds or more thereof and the like.

Examples of materials for the conductor layers 23, 26, and 27 and conductive path(s) 24, 25, and 28 shown in FIG. 4 include simple metals selected from among copper, gold, silver, platinum, lead, tin, nickel, cobalt, indium, rhodium, chromium, tungsten, ruthenium and the like, and alloys comprising one or more thereof (e.g., solders, nickel-tin, gold-cobalt and the like). In particular, metals that permit electroplating or electroless plating are preferably used. Copper is preferred because of its excellency in the ease of forming a conductor layer circuit pattern and electrical characteristics.

The thickness of the conductor layer 23 may be chosen as appropriate in, but is not limited to, the range of 1 to 50 µm. The conductive path(s) 24 and 25 are preferably cylindrical in shape, the diameter thereof being 5 to 500 µm, preferably 5 to 300 µm.

Preferred materials for the metal support layer include, but are not limited to, copper, copper alloys based primarily on copper, nickel, nickel alloys based primarily on nickel, alloys based primarily on nickel and iron, stainless steel (SUS304, SUS403), and the like.

To minimize the difference in the coefficient of linear expansion from the semiconductor chip, an alloy based primarily on nickel and iron (e.g., 42 alloy) is preferably used.

The thickness of the metal support layer is variable depending on the rigidity of the material, and is preferably about 10 µm to 200 µm, more preferably about 20 µm to 80 µm.

When the thickness of the metal support layer is less than 10 µm, creases and wrinkles are likely to occur in the metal support layer, which in turn reduces the handleability in the roll process. If the thickness of the metal support layer exceeds 200 µm, the winding diameter increases due to the rigidity thereof, which in turn hampers the handling in the roll process and also interferes with the processing by etching.

To facilitate the smoother separation of the metal support layer and wiring circuit substrate, a structure is preferable wherein a release layer is present therebetween. It is preferable that the release layer be formed in a way such that the release layer is easily detached from the wiring circuit substrate and is unlikely to detach from the metal support layer, and that the release layer is removable, together with the metal support layer, from the wiring circuit substrate.

Useful materials for the release layer include organic substances (silicone resin, polyimide and the like) and inorganic substances (metals, metal oxides, inorganic oxides and the like). The inorganic substances are exemplified by Ag, Ti, W, Ni, $SiO_2$ and the like.

Considering the step of producing a wiring circuit substrate and the high heat conditions during chip mounting on the wiring circuit substrate, greater preference is given to polyimide and the aforementioned inorganic substances because silicone resin can deteriorate.

When the release layer is formed as a polyimide layer, the thickness thereof is preferably 0.1 to 10 µm, with further preference given to 0.1 to 5 µm in preventing the entire wiring circuit substrate from bowing.

When the release layer is made of one of the aforementioned inorganic substances, the thickness thereof is preferably 1 to 100 nm, with further preference given to 1 to 50 nm in preventing the entire wiring circuit substrate from bowing.

When the release layer is a polyimide layer, useful methods of forming the layer include solution coating, electrodeposition or chemical vapor deposition (CVD), stacking of a separately formed polyimide film, and the like. When the release layer is made of an inorganic substance such as a metal, metal oxide, or inorganic oxide, useful methods of forming the layer include electroplating, vacuum evaporation, sputtering and the like.

The resin composition for sealing that constitutes a sheet-shaped resin composition may be any one that can be utilized to seal chips. A preferred composition is, for example, an epoxy resin composition containing the following ingredients A to E, and this can be used after being prepared as a sheet.

Ingredient A: epoxy resin
Ingredient B: phenol resin
Ingredient C: elastomer
Ingredient D: inorganic filler
Ingredient E: curing promoter Useful epoxy resins for the ingredient A include, but are not limited to, for example, various epoxy resins such as dicyclopentadiene type epoxy resin, cresol novolak type epoxy resin, phenol novolak type epoxy resin, bisphenol A type epoxy resin, bisphenol F type epoxy resin, biphenyl type epoxy resin, and tris-hydroxyphenylmethane type epoxy resin. These epoxy resins may be used alone or in combination of two kinds or more. From the viewpoint of softness prior to curing and capability to follow uneven surfaces, liquid bisphenol A type epoxy resin particularly preferred.

As far as they react with epoxy resins for the ingredient A, useful phenol resins for the ingredient B include, but are not limited to, for example, dicyclopentadiene type phenol resin, phenol novolak resin, cresol novolak resin, phenol aralkyl resin and the like. These phenol resins may be used alone or in combination of two kinds or more. The phenol resin used is preferably one having a hydroxyl group equivalent of 70 to 250 and a softening point of 50 to 110° C., with greater preference given to phenol novolak resin because of its high curing reactivity.

The blending ratio of the ingredient A epoxy resin and the ingredient B phenol resin is usually preferably such that the total amount of hydroxyl groups in the phenol resin (ingredient B) is 0.7 to 1.5 equivalents, more preferably 0.9 to 1.2 equivalents, per equivalent of epoxy groups in the epoxy resin (ingredient A).

Elastomers for the ingredient C, which is used along with the ingredients A and B, confer softness and flexibility to the epoxy resin composition. The structure thereof is not subject to limitations, as far as this action is exhibited. Examples of such elastomers include rubber polymers, exemplified by various acrylate copolymers such as polyacrylates, and polymers made of butadiene rubber, styrene-butadiene rubber (SBR), ethylene-vinyl acetate copolymer (EVA), isoprene rubber, acrylonitrile rubber or the like. These polymers may be used alone or in combination of two kinds or more.

Regarding the content ratio of the ingredient C elastomer, it is preferable from the viewpoint of conferring softness and flexibility that the content ratio be set in the range of 3 to 70% by weight, more preferably at 5 to 30% by weight, in the total organic ingredient content in the epoxy resin composition in the total organic ingredient content.

If the content ratio of the ingredient C elastomer is less than the lower limit, it is difficult to confer desired softness and flexibility, and the handling workability of the elastomer as a sheet-shaped resin composition for chip sealing tends to decrease. Conversely, if the content ratio exceeds the upper limit, the post-curing elastic modulus decreases, and the strength of the molded product tends to be insufficient.

Useful inorganic fillers for the ingredient D, which is used along with the ingredients A to C, include, but are not limited to, various conventionally known fillers such as quartz glass powder, talc, silica powders (molten silica powder, crystalline silica powder and the like), alumina powder, aluminum nitride, and silicon nitride powder. These fillers may be used alone or in combination of two kinds or more. Particularly preferred from the viewpoint of the reduction of the linear expansion coefficient of the cured product are silica powders, with greater preference given to molten silica powders because of their high filling property and high fluidity. Molten silica powders include spherical molten silica powders and disrupted molten silica powders; it is preferable from the viewpoint of fluidity to use a spherical molten silica powder. In particular, a spherical molten silica powder having an average particle diameter of 0.2 to 30 μm is preferably used, more preferably in the range of 0.5 to 15 μm.

The content ratio of the ingredient D inorganic filler is preferably set in the range of 60 to 95% by weight, particularly 75 to 90% by weight, of the entire epoxy resin composition As far as they are capable of promoting the curing reaction of the aforementioned epoxy resin (ingredient A) and phenol resin (ingredient B), useful curing promoters for the ingredient E, which is used along with the ingredients A to D, include, but are not limited to, various conventionally known curing promoters. Existing curing promoters such as phosphorus-based curing promoters, amine-based curing promoters, and imidazole-based curing promoters can be used, with preference given to an imidazole-based curing promoter because it enables the obtainment of a thermosetting sheet-shaped resin composition of excellent curability. In using the sheet-shaped resin composition, it is preferable from the viewpoint of workability and quality stability that the composition be storable at normal temperature for a long period. Preferably useful curing promoters for the ingredient E with these desirable characteristics include, for example, 2-phenyl-4,5-dihydroxymethyl imidazole and the like.

It is preferable that the content ratio of the ingredient E curing promoter be set in the range of 0.1 to 5% by weight, more preferably 0.3 to 3% by weight, particularly preferably 0.5 to 2% by weight, of the total amount of the epoxy resin composition.

In the present invention, the epoxy resin composition may be blended as appropriate with, in addition to the ingredients A to E, as required, other additives such as a flame retardant, carbon black and other pigments.

Examples of the flame retardant include organic phosphorus compounds, antimony oxide, metal hydroxides such as aluminum hydroxide and magnesium hydroxide, and the like. These flame retardants may be used alone or in combination of two kinds or more.

As a preferred sheet-shaped resin composition used in the present invention, a sheet-shaped epoxy resin composition can, for example, be produced as described below.

First, the individual ingredients are blended to prepare an epoxy resin composition by any method that ensures uniform dispersion and blending of the ingredients.

Subsequently, the ingredients are dissolved in a solvent or the like if required, and a film is prepared by varnish coating. Alternatively, the various ingredients may be kneaded as they are using a kneader and the like to prepare a solid resin, which may be then extruded into a sheet form to obtain a film. The varnish coating method, in particular, is suitably used because it enables easy obtainment of a sheet of uniform thickness.

Preparation of a sheet-shaped epoxy resin composition by the varnish coating method is described below.

The ingredients A to E and, if required, other additives are blended as appropriate by a conventional method, and uniformly dissolved or dispersed in an organic solvent to yield a varnish. Subsequently, this varnish is coated and dried on a substrate such as a polyester film, and then covered with a film such as a polyester film, and the resulting sheet-shaped epoxy resin composition is rolled up.

The choice of the organic solvent is not particularly limited; various conventionally known organic solvents can be used, including, for example, methyl ethyl ketone, acetone, dioxane, diethyl ketone, toluene, ethyl acetate and the like. These organic solvents may be used alone or in combination of two kinds or more. The ingredient concentration in the organic solvent is usually preferably in the range of 30 to 60% by weight.

After the organic solvent is dried off, the thickness of the sheet-shaped epoxy resin composition is not particularly limited, but it is usually preferable from the viewpoint of thickness uniformity and the amount of residual solvent that the thickness be set at 5 to 100 μm, more preferably 20 to 70 μm. The thus-obtained sheet-shaped epoxy resin composition may be used in a lamination to obtain a desired thickness, if a larger amount of resin is required in chip sealing and molding and other cases. Hence, the sheet-shaped epoxy resin composition may be used in a single-layer structure, or may be used as a lamination comprising two layers or more.

The thickness of the sheet-shaped epoxy resin composition required in the actual chip sealing step varies depending on chip size, size of the wiring circuit substrate placed in the mold, chip mounting density on the substrate, the thickness of the resin layer covering the chip and the like; a thicknesses of roughly about 200 to 1000 μm, particularly 400 to 800 μm, is useful in sealing ordinary chips.

Thermal curing of the sheet-shaped epoxy resin composition is usually performed in the temperature range of 120 to 190° C., heating time of 1 to 60 minutes and a pressure of 0.1 to 10 MPa.

In case of a sheet-shaped resin composition made of another sealing resin composition as well, a heating temperature, heating time, and pressure suitable for the material may be employed.

Although any die for sheet molding capable of providing external dimensions of the package after chip sealing is acceptable, an existing die for compression molding and the like can generally be used.

A chip-mounted substrate is placed in a molding die, a sheet-shaped epoxy resin composition is placed on the chip, and the chamber in which the die is placed is decompressed, after which pressing and molding are performed under the aforementioned conditions.

Provided that the wiring circuit substrate has a large area assuming division by dicing and the like, with a plurality of chips regularly arranged thereon, as shown in FIG. 1, the peeling step may be followed by a division step to yield individual semiconductor devices.

An external connecting conductor portion is included in the lower face of the wiring circuit substrate becoming exposed upon separation of the metal support layer. A surface of the external connecting conductor portion thereof may be processed to provide bumps or solder balls, as shown in FIG. 1(e).

EXAMPLE

The manufacturing method of the present invention is hereinafter described more specifically and in further detail by means of the following example of actual production.

Example 1

Figure 5:
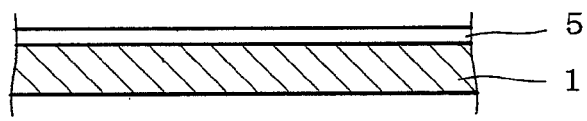
FIG. 5 shows example procedures of foaming a wiring circuit substrate.
Figure 5:
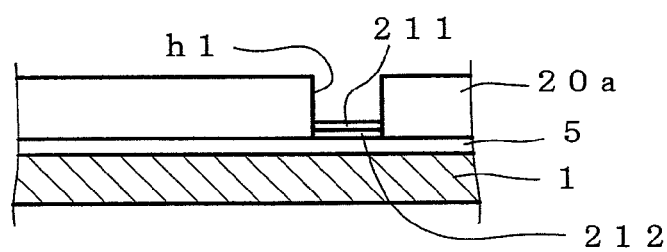
Figure 5:
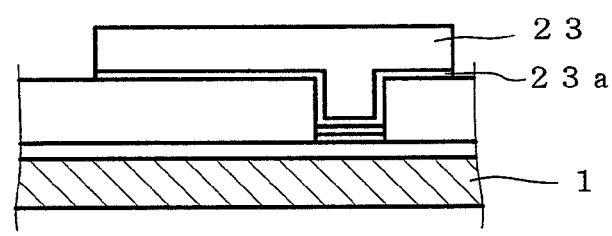
Figure 5:
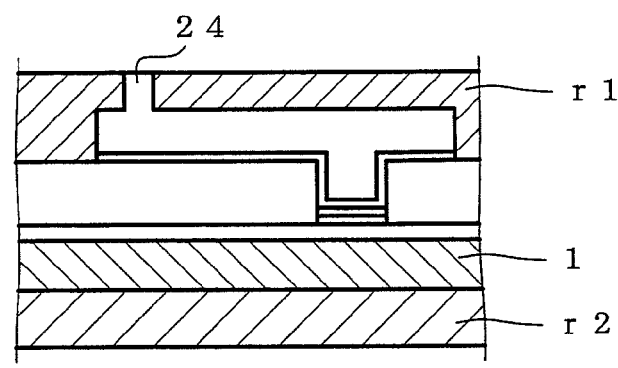
Figure 5:
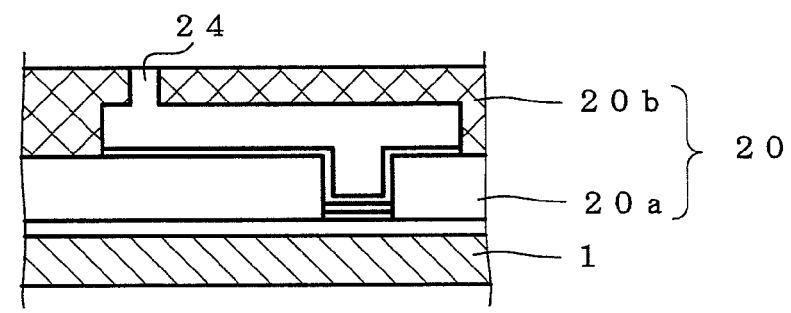
Figure 6:
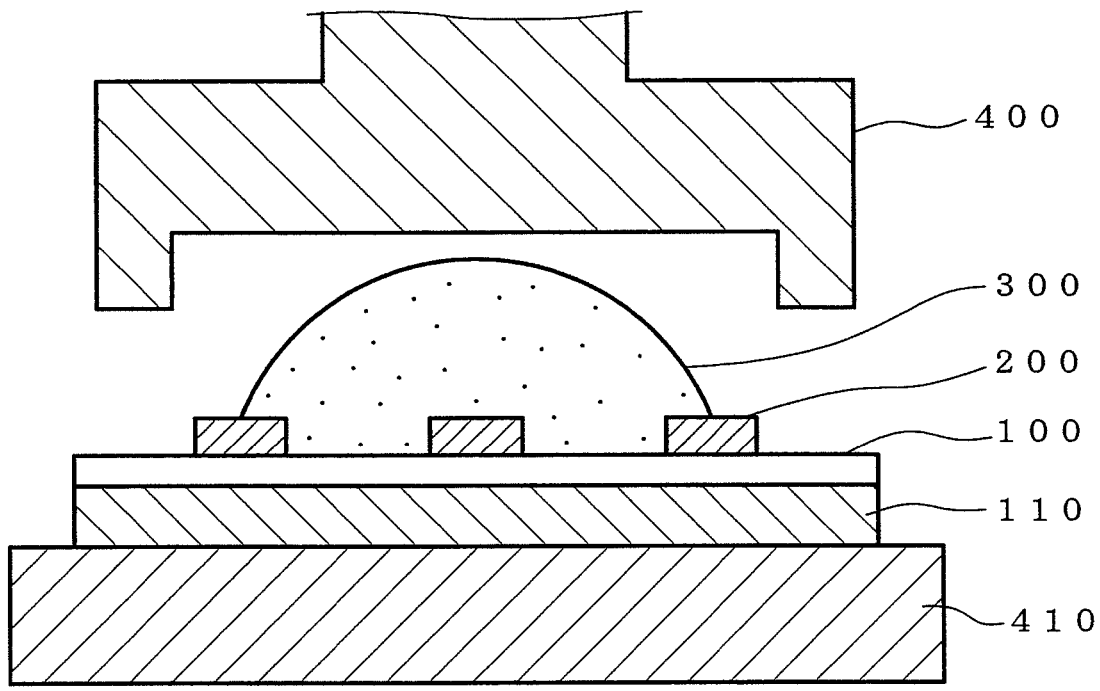
FIG. 6 shows schematic diagrams of conventional resin sealing operation.
Figure 6:
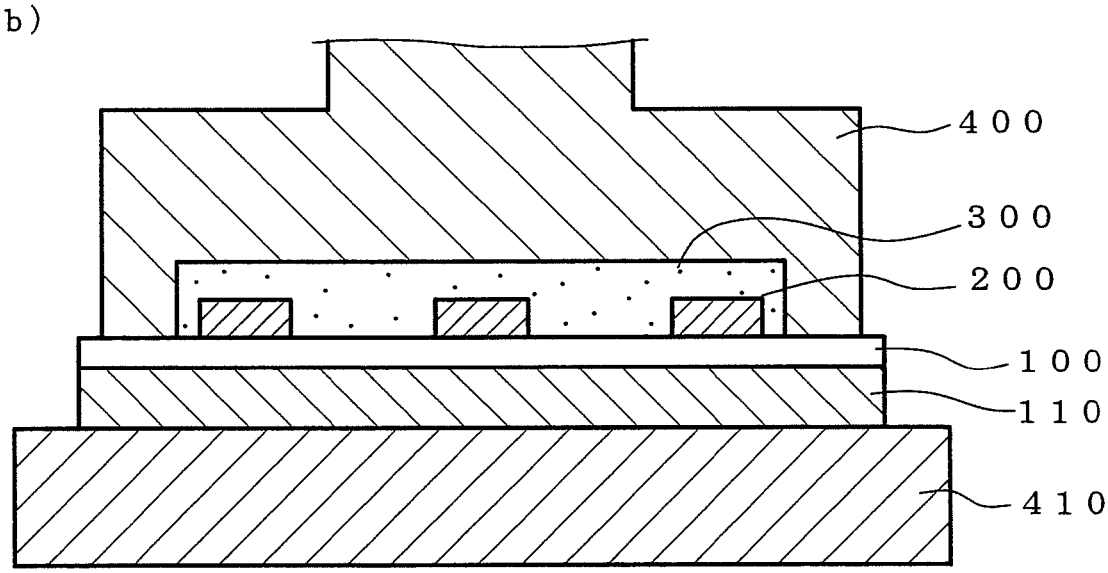

In this Example, as shown in FIG. 5, a release layer 5 of titanium was formed on a metal support layer 1 of stainless steel (SUS403), a wiring circuit substrate 20 to serve as a rewiring layer for semiconductor chips was formed thereon and connected to the chips, and the chips were sealed using a sheet-shaped epoxy resin composition.

The wiring circuit substrate had on the upper face thereof mounting regions of the same shape arranged in a repeated pattern to allow the semiconductor chips to be mounted in the arrangement of (4×11) matrix.

Each semiconductor chip had a square outer periphery 10 mm long in each side, comprised 240 electrode pads, each pad being circular and 80 μm in diameter, with a gold bump 60 μm in diameter formed on each pad.

[Formation of Release Layer]

As shown in FIG. 5(a), a 100 nm thick release layer of titanium was formed by titanium (Ti)-targeted sputtering on the entire surface of a metal support layer 1 prepared with a 25 μm thick foil of SUS304.

[Formation of Base Insulating Layer and Formation of Metal Film for Contact Point]

As shown in FIG. 5(b), a polyimide layer (base insulating layer) 20a was formed using a light-sensitive polyamic acid (prepared by a reaction of 3,4',3,4'-biphenyltetracarboxylic acid dianhydride, 4,4'-diaminodiphenyl ether, and para-phenylenediamine, and containing a photosensitizer). An opening h1 was made at the position where a conductor portion for external connection was to be formed. The release layer 5 was exposed to the bottom of the opening. The base insulating layer was 10 μm in thickness, and the opening was circular in shape and 100 μm in diameter.

A gold layer 212 (0.5 μm thick) and a nickel layer 211 (2 μm thick) were sequentially formed by electroplating on the surface of the release layer 5 exposed in the opening h1. Thus, the gold layer 212 was allowed to become exposed to the outside upon removal of the metal support layer together with the release layer.

[Formation of Seed Film, Lower Conductive Path, and Conductor Layer]

As shown in FIG. 5(c), sputtering with chromium and then with copper was performed to form a seed film 23a (chromium layer thickness 50 nm, copper layer thickness 100 nm), and a 10 μm thick conductor layer 23 with a specified wiring pattern and a conductive path 25 were formed by electrolytic copper plating. Subsequently, the portion of the seed film where the conductor layer 23 was absent was removed.

As shown in FIG. 5(d), the upper face of the conductor layer 23 was covered with a plating resist r1 (except for the portion where to foam a conductive path), and the lower face of the metal support layer 1 was entirely covered with a resist r2; a conductive path 24 having a diameter of 80 μm and a height of 15 μm was formed by solder plating. The upper end of this conductive path serves as a terminal for connection to the electrode of the semiconductor chip.

[Formation of Adhesive Layer]

As shown in FIG. 5(e), the plating resists r1 and r2 were removed, an adhesive layer 20b based primarily on epoxy and polyimide was formed in a way such that the exposed conductor layer 23 and conductive path 24 were embedded, and the adhesive layer was etched using an alkaline solution in a way such that the upper end face of the conductive path 24, as a terminal portion, was exposed on the upper face of the adhesive layer.

[Mounting Step]

Chips were mounted on all mounting regions of the wiring circuit substrate thus obtained (with a metal support layer provided in a way such that it can be separated), as shown in FIG. 1(a).

The chips were aligned and mounted in a degree of vacuum of 3 Pa at a temperature of 300° C. under a pressure of 1.5 g/bump, using an aligner and bonding apparatus (manufactured by EV Group Japan K.K.), after which the adhesive layer was aged at 180° C. for 2 hours.

[Formation of Sheet-Shaped Epoxy Resin Composition]

The sheet-shaped epoxy resin composition used in this Example was formed as described below.

First, the following ingredients were blended in the ratio shown below to yield a sheet coating varnish.

Epoxy resin: bisphenol A type epoxy resin (EPON825, produced by Japan Epoxy Resins Co., Ltd.), 8.2 parts by weight Phenol resin: novolak type phenol resin (ND-564, produced by Showa Highpolymer Co., Ltd.), 5.0 parts by weight Acrylic resin: acrylate copolymer (TEISAN RESIN SG-P3, produced by Nagase ChemteX Corporation), 1.5 parts by weight Curing promoter: 2-phenyl-4,5-dihydroxymethylimidazole (2PHZ-PW, Shikoku Chemicals Corporation), 0.2 parts by weight Silica powders: spherical molten silica powder having an average particle diameter of 5.5 μm (FB-7SDC, produced by Denki Kagaku Kogyo K.K.), 64.3 parts by weight; spherical molten silica powder having an average particle diameter of 0.5 μm (SO-25R, produced by Admatechs Co., Ltd.), 20 parts by weight Carbon black: #20, produced by Mitsubishi Chemical Corporation, 0.8 parts by weight Organic solvent: methyl ethyl ketone, 100 parts by weight The sheet-shaped epoxy resin composition used for chip sealing had a thickness of 600 μm. In this Example, a resin composition of this thickness with good quality was prepared by stacking 12 films of 50 μm thickness bonded sequentially to have a total thickness of 600 μm using a roll laminator.

First, the sheet coating varnish formed above was coated and dried on a first polyester film of 50 μm thickness using a comma coater to obtain a 50 μm thick epoxy resin composition layer, and a second polyester film of 38 μm thickness was put thereon to form a 3-layer lamination [second polyester film (38 μm thick)/epoxy resin composition layer (50 μm thick)/first polyester film (50 μm thick)]. A total of 12 sheets with this 3-layer structure were formed.

Subsequently, the second polyester film of each of the laminations was separated, and the epoxy resin composition layer (50 μm thick) was bonded in close contact to the epoxy resin composition layer (50 μm thick) of another lamination; whereby six sheets of second laminations [first polyester film/epoxy resin composition layer (100 μm thick)/first polyester film] were formed.

Furthermore, the first polyester film on one side of each of these six laminations was separated, and the epoxy resin composition layer (100 μm thick) was bonded in close contact to the epoxy resin composition layer (100 μm thick) of another lamination, whereby three sheets of third laminations [first polyester film/epoxy resin composition layer (200 μm thick)/first polyester film] were formed.

Furthermore, each of two of said three sheets the first polyester film on one side of laminations was separated, and the epoxy resin composition layer (200 μm thick) was put in close contact to the epoxy resin composition layer (200 μm thick) of the other lamination, whereby one fourth lamination [first polyester film/epoxy resin composition layer (400 μm thick)/first polyester film] was formed.

Furthermore, the first polyester film of each of the fourth lamination obtained above and the remaining one third lamination was separated in the same manner as the above, and the epoxy resin composition layers of the two laminations were put in close contact to each other, whereby one fifth lamination [first polyester film/epoxy resin composition layer (600 μm thick)/first polyester film] was obtained.

Finally, the first polyester films on the two outsides were separated to yield a 600 μm thick sheet-shaped epoxy resin composition.

[Sealing Step]

A wiring circuit substrate (with a metal support layer provided separably separated having chips mounted thereon as described above (FIG. 1(a)) was placed in a die, the sheet-shaped epoxy resin composition obtained above was placed thereon as shown in FIG. 1(b), and the chamber surrounding the die was vacuumized.

The die was then pressed against the sheet-shaped epoxy resin composition under the following temperature and pressure conditions to soften the resin composition, whereby each chip was molded.

Regarding the operating conditions for covering the chips with the sheet-shaped epoxy resin composition, a load was exerted using a mechanical press to apply a pressure of 300 kPa on the sheet-shaped epoxy resin composition in a vacuum of 0.1 kPa at a temperature of 130° C., whereby the sheet-shaped epoxy resin composition was softened. Thus, the epoxy resin composition covered the chip, as shown in FIG. 1(c).

Thereafter, the composition was returned to the atmosphere, the die was opened, and the molded product was taken out.

Under atmospheric pressure, the epoxy resin composition was completely cured under heating at 150° C. for 1 hour.

[Peeling Step and Dicing]

As shown in FIG. 1(d), the metal support layer 1, together with the release layer 5, was separated from the base insulating layer 2.

Subsequently, as shown in FIG. 1(e), solder balls were formed on the surface of the gold layer, wherein the surface is the end face of the external connecting conductor portion exposed to the base insulating layer.

Finally, as shown in FIG. 1(f), the molded product was divided by dicing into individual semiconductor devices.

[Evaluation]

This Example confirmed that the steps after chip mounting, from resin sealing to metal support layer separation, can be performed by extremely simple operations in a short time.

It was also found that quality failures due to unwanted chip shifts and breakage, which occur in chip sealing with a liquid resin in the conventional art, are sufficiently reduced. Another finding was that the recovered metal support layer is reusable.

[Industrial Applicability]

The manufacturing method of the present invention contributes to increasing the productivity for resin-sealed semiconductor devices and reducing the quality failure rate, because semiconductor chips can easily be sealed with a resin after being mounted on a flexible wiring circuit substrate a supported by a metal support layer, and also because the metal support layer can easily be separated. Additionally, the metal support layer is reusable and etching is unnecessary, so that the manufacturing method of the present invention is economically advantageous and has a reduced environmental impact.

This application is based on a patent application No. 2009-280806 filed in Japan, the contents of which are incorporated in full herein.

The invention claimed is:

1. A method of producing a semiconductor device having a structure wherein a semiconductor chip is mounted on a wiring circuit substrate and sealed with a resin, wherein the method comprises the steps of:

forming a wiring circuit substrate having, on a metal support layer, a connecting conductor portion that can be connected to an electrode of the semiconductor chip in a way such that the wiring circuit substrate can be separated from the metal support layer, and such that the connecting conductor portion is located on the upper face side of the wiring circuit substrate, connecting the connecting conductor portion of the wiring circuit substrate and the electrode of the semiconductor chip to mount the semiconductor chip on the wiring circuit substrate, placing a sheet-shaped resin composition made of a sealing resin composition on the semiconductor chip mounted on the wiring circuit substrate, heating the sheet-shaped resin composition to seal the semiconductor chip with the sealing resin composition, and separating the metal support layer from the wiring circuit substrate after sealing.

2. The manufacturing method according to claim 1, wherein the sheet-shaped resin composition is a sheet-shaped epoxy resin composition containing an epoxy resin, a phenol resin, an elastomer, an inorganic filler, and a curing promoter as ingredients.

3. The manufacturing method according to claim 2, wherein a release layer is present between the metal support layer and the wiring circuit substrate, whereby the wiring circuit substrate can be separated from the metal support layer.

4. The manufacturing method according to claim 3, wherein the release layer is made of polyimide.

5. The manufacturing method according to claim 3, wherein the release layer is made of one material selected from among metal, metal oxide, and inorganic oxide.

6. The manufacturing method according to claim 1, wherein a release layer is present between the metal support layer and the wiring circuit substrate, whereby the wiring circuit substrate can be separated from the metal support layer.

7. The manufacturing method according to claim 6, wherein the release layer is made of polyimide.

8. The manufacturing method according to claim 6, wherein the release layer is made of one material selected from among metal, metal oxide, and inorganic oxide.

* * * * *